(12) United States Patent
Nilson

(10) Patent No.: US 7,395,472 B2
(45) Date of Patent: Jul. 1, 2008

(54) METHOD AND A UNIT FOR PROGRAMMING A MEMORY

(75) Inventor: Christofer Nilson, Molndal (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 518 days.

(21) Appl. No.: 11/027,687

(22) Filed: Jan. 3, 2005

(65) Prior Publication Data

US 2005/0204230 A1 Sep. 15, 2005

Related U.S. Application Data

(63) Continuation of application No. PCT/SE02/01337, filed on Jul. 3, 2002.

(51) Int. Cl.
*G01R 31/28* (2006.01)
(52) U.S. Cl. .................................................. 714/727
(58) Field of Classification Search ................ 714/726, 714/725, 727
See application file for complete search history.

(56) References Cited

U.S. PATENT DOCUMENTS

| 5,596,734 | A | | 1/1997 | Ferra | |
|---|---|---|---|---|---|
| 5,657,442 | A | * | 8/1997 | Groves | ......................... 714/28 |
| 6,324,096 | B1 | | 11/2001 | Tomita | |
| 6,499,122 | B1 | * | 12/2002 | Coomes | ...................... 714/724 |
| 6,925,583 | B1 | * | 8/2005 | Khu et al. | ..................... 714/30 |
| 6,973,588 | B2 | * | 12/2005 | DeMeo et al. | ................. 714/6 |
| 2003/0212897 | A1 | * | 11/2003 | Dickerson et al. | ........... 713/200 |
| 2006/0156099 | A1 | * | 7/2006 | Sweet et al. | ................ 714/724 |

FOREIGN PATENT DOCUMENTS

WO 91/07753 5/1991

\* cited by examiner

*Primary Examiner*—James C Kerveros
(74) *Attorney, Agent, or Firm*—Nixon & Vanderhye P.C.

(57) ABSTRACT

A unit and a method of programming mounted programmable memories by a programming boundary scan component/unit being directly coupled to the programmable memory and directly coupled to a boundary scan test system. Directly coupling the memory to the programming boundary scan component Thereby eliminates having to serially clock information to and from the programmable memory through a number of other boundary scan components/units. The drive routines for programming the programmable memory by means of a boundary scan test system only needs to be modified as to the length of the serial boundary scan cell chain.

5 Claims, 4 Drawing Sheets

METHOD AND A UNIT FOR PROGRAMMING A MEMORY

This application is a continuation of international application PCT/SE2002/001337, filed Jul. 3, 2002, which designated the U.S. The entire content of which is hereby incorporated by reference.

TECHNICAL FIELD

The invention concerns programming programmable memories and is more particularly directed to using boundary scan components for programming programmable memories.

BACKGROUND

The methodology of programming programmable memories, such as proms, eproms, eeproms, and flash memories, has changed through the years. In the beginning programmable memories were programmed in a special apparatus, a prom programmer, before the programmable memory was mounted on a circuit board it was meant to operate on. During approximately the same time period, circuit boards were first tested as to their electrical copper tracks, and then after all components had been mounted, their functionality was tested by placing the circuit boards in different test jigs. This type of testing, referred to as in-circuit tests, where components were contacted via bed-of-nail fixtures, has become more and more difficult to realize due to increased complexity. This prompted a replacement of physical contacting via nails with design-integrated pin electronics, electronic nails. An IC's functional core logic is isolated by having scan cells integrated directly on the silicon boundary, functionally commonly between the IC's functional core logic and the IC's physical pins. Scan cells can thus either be transparent, i.e. functionally removed, or intercept outgoing and incoming signals to and from physical pins or the core logic. Further, the scan cells are serially coupled together in a scan cell chain. Scan cells are available in various types, such as capture cells for measurements only and universal cells for measurements and stimulation, and comprises a number of clocked latches.

The scan cells' line interconnection, the scan cell chain, allows test vectors to be serially shifted on to the IC's physical pins as well as allowing scanning and shifting out of externally applied information. Standard IEEE 1149.1 defines a uniform, chip-internal test control logic as well as a standardized bus interface, a testbus. The testbus only needs four lines, with an optional fifth reset line, for complete control. Using this boundary scan architecture, manufacturing faults such as opens, shorts and misplacements are easily detected and localized. The potential of the boundary scan architecture has expanded its fields of application to also include in-system programming of programmable memory devices. A circuit board can thus be manufactured with all components mounted, including programmable memories, and then be tested and programmed for use. Which means that first when a circuit board has to be delivered, its programmable memories are programmed with the latest upgraded software.

Unfortunately as memory sizes increase so does the programming time. Attempts have been made to come to grips with these ever-increasing programming times, for example by increasing the serial clock rate of the boundary scanning. This method of decreasing the programming times is unfortunately heavily dependent on the boundary scan components and their maximum clock rate, and the boundary scan test system's maximum clock rate. There is still room for improvement on how to decrease programming times in a boundary scan environment.

SUMMARY

An object of the invention is to define a method and a unit of decreasing programming times when programming a programmable memory by means of a boundary scan test system.

A further object of the invention is to define a unit and a method of reducing manufacturing costs of circuit boards with mounted programmable memories.

The aforementioned objects are achieved by a unit and a method of programming mounted programmable memories. A programming boundary scan component/unit is directly coupled to the programmable memory and directly coupled to a boundary scan test system, thereby eliminating having to serially clock information to and from the programmable memory through a number of other boundary scan components/units. The drive routines for programming the programmable memory by a boundary scan test system only need to be modified as to the length of the serial boundary scan cell chain. The programming boundary scan component preferably only comprises a necessary number of boundary scan cells in its boundary scan cell chain, that are necessary to control, via I/O pins, the programming of a programmable memory. Coupling and uncoupling of the programming boundary scan unit to the programmable memory is preferably by means of an appropriate test clip or equivalent device.

A unit for programming a programmable memory by means of boundary scan test equipment comprises a test clip, a boundary scan connector, and a programming boundary scan unit. The test clip is arranged to be directly attachable to and removable from the programmable memory. The boundary scan connector is arranged to be connected with boundary scan programming equipment. The programming boundary scan unit comprises a test access port connected to the boundary scan connector. The programming boundary scan unit further comprises boundary scan cells, which are connected to the test clip. The programming boundary scan unit is arranged to receive instructions, addresses, and corresponding data via its test access port by means of the boundary scan connector, to thereby be able to control the boundary scan cells to enable programming of the programmable memory.

The boundary scan unit of the unit for programming a programmable memory by means of boundary scan test equipment preferably only uses boundary scan cells to be connected to the test clip. This is to minimize the boundary scan cell chain length. To decrease the chain length even further, the boundary scan unit can suitably only use boundary scan cells that are used for the programming of the programmable memory.

A method of programming a programmable memory by means of boundary scan test equipment comprises a plurality of steps. In a first step a programming boundary scan unit is arranged to have boundary scan cells and to have a test access port. The programming boundary scan unit is connected to a test clip or the like by means of the boundary scan cells. The programming boundary scan unit is further connected to a boundary scan connector by means of the test access port. In a second step the test clip is connected directly onto the programmable memory. In a third step the boundary scan connector is connected to the boundary scan test equipment. After the first, second and third step, a fourth step programs the programmable memory by executing a boundary scan program comprising instructions and information for programming the programmable memory. The boundary scan program resides in the connected boundary scan test equipment. Finally in a fifth step the test clip is removed from the programmable memory.

Suitably the fourth step of programming the programmable memory executes a boundary scan program that only comprises instructions and information for programming the programmable memory.

By providing a method and a unit for programming a programmable memory directly by means of a boundary scan test equipment/system according to the invention a plurality of advantages over prior art methods and systems of programming programmable memories by means of boundary scan test equipment are obtained. Improved programming speed obtained by directly coupling a boundary scan unit/component by means of a test clip or the like to a memory to be programmed, to thereby avoid long boundary scan cell chain lengths to and from access points to the memory. The boundary scan unit/component that is used for programming the programmable memory can further be a very high speed device, which will decrease programming times even further. The use of a high speed programming boundary scan component does not increase the cost of the circuit board since the components on the board does not have to be high speed boundary scan devices. Further, also boards comprising programmable memories but which do not comprise any boundary scan components can also be programmed by standardized boundary scan test systems. Other advantages will become apparent from the detailed description.

DETAILED DESCRIPTION

Figure 1:
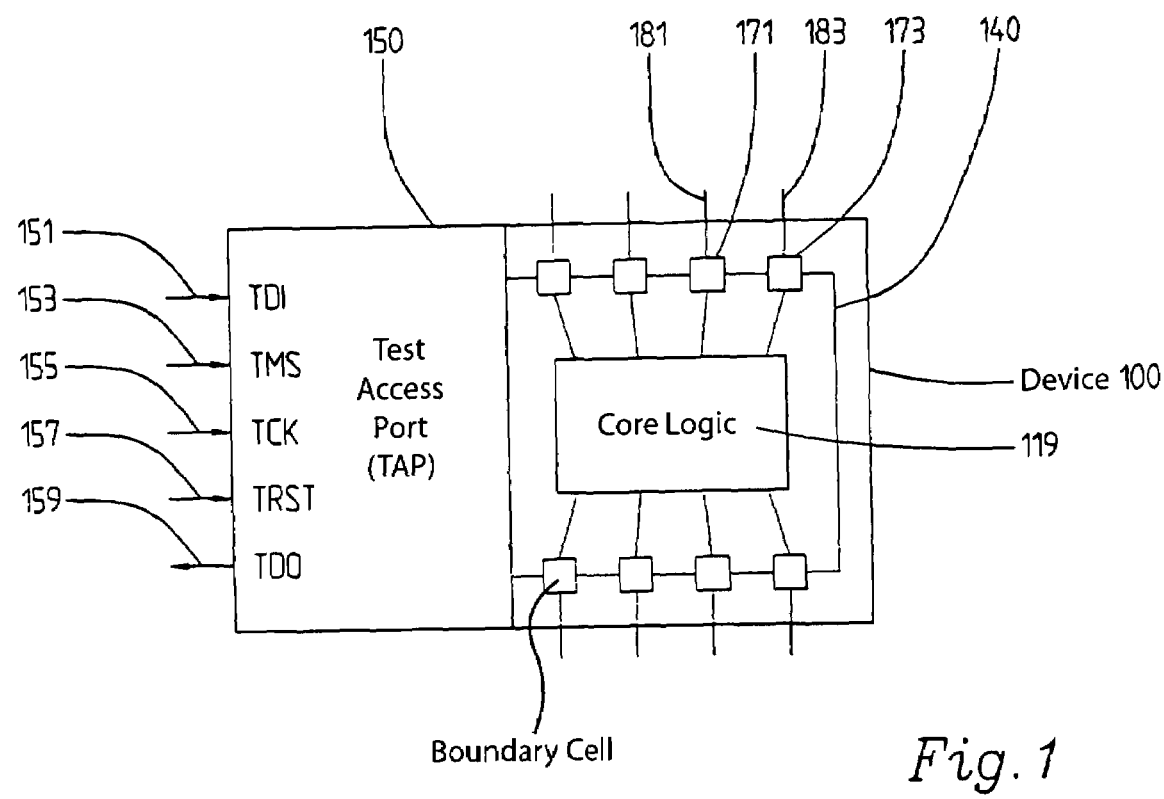
FIG. 1 illustrates a device with boundary scan architecture.

FIG. 1 illustrates a device 100 with boundary scan architecture. The integrated circuit has a functional core logic 119, which is tested as to function on its own and in conjunction/interaction with other components. To enable the testing, a number of boundary cells 171, 173 are connected in between the core logic 119 and corresponding IC pins 181, 183. The boundary cells 171, 173 are further interconnected 140 in a serial chain, which becomes longer the more pins an IC has. The serial chain of interconnections 140 starts and ends in a test access port (TAP) 150, which is the "back door" into the IC 100 for testing/control purposes. The test access port 150 uses at least four physical pins into the real world, a test data input (TDI) 151, a test mode select (TMS) 153, a test clock (TCK) 155, a test data out (TDO) 159, and optionally a fifth pin, a test reset (TRST) 157. By serially controlling the test access port 150, the core logic 119 can be tested, as well as external components by setting the appropriate boundary cells 171, 173 into desired levels and then reading the response by means of other boundary cells.

Figure 2:
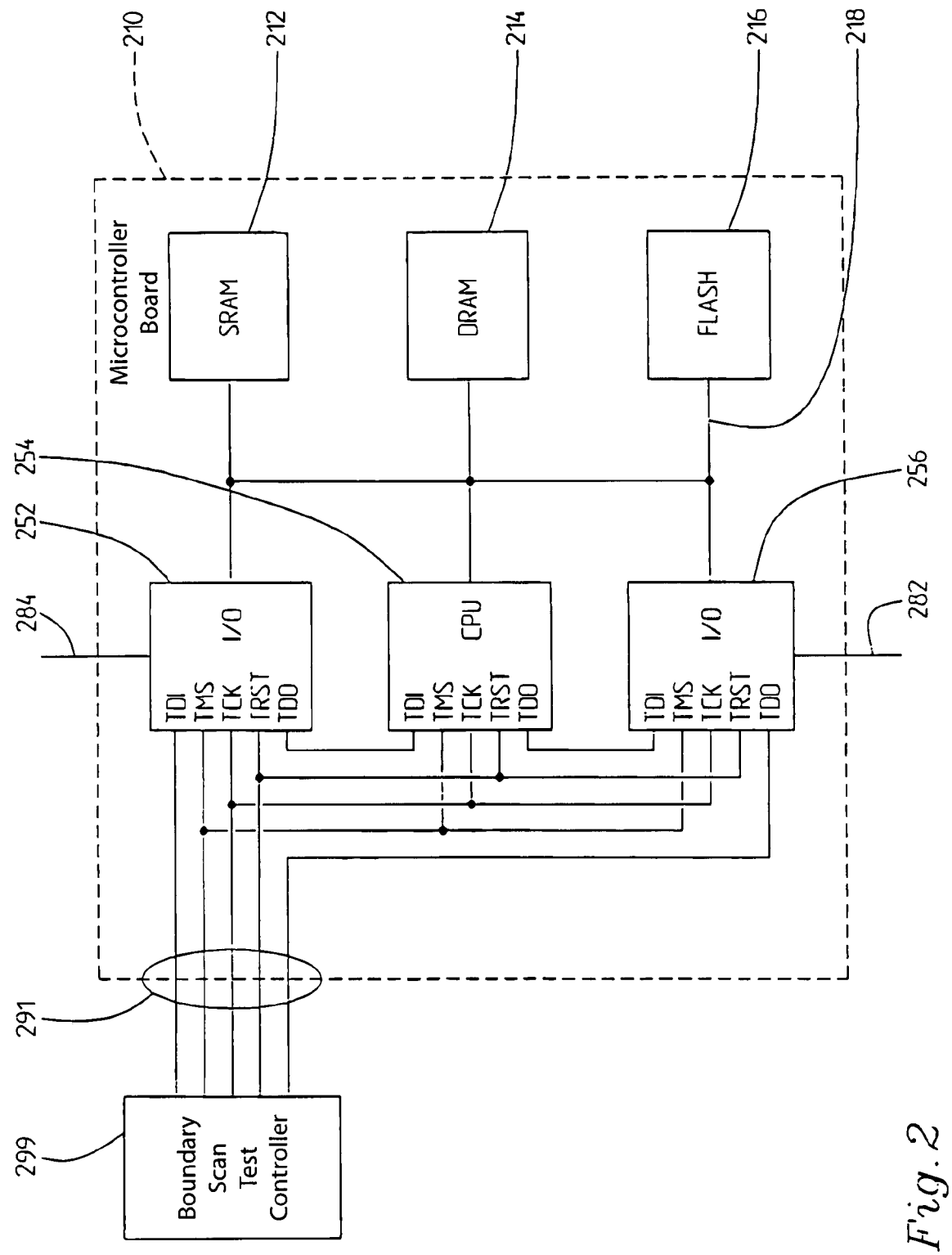
FIG. 2 illustrates a typical boundary scan test setup with a microcontroller board.

Typically a circuit board comprises a number of boundary scan components, and a number of components without a test access port 150. FIG. 2 illustrates such a typical boundary scan test setup with a microcontroller board 210. The board 210 comprises a first I/O controller 252, a second I/O controller 256, a CPU 254, static ram 212, dynamic ram 214, and programmable program memory 216 all interconnected with a data and address bus 218. The first I/O controller 252 will typically comprise I/O lines 284 to support a USB, a parallel port, etc. The second I/O controller 256 will typically comprise I/O lines 282 to support a user interface. For testing purposes a boundary scan test controller 299 is connected to the circuit board by means of a test bus 291. The test bus 291 will give parallel access to the test clock, the test reset, the test mode select of all of the components with a test access port. But test data is clocked serially from one boundary scan component to the next. In this example the test data input enters the first I/O controller 252, to then exit the second I/O controller as test data output after having also passed through the CPU 254. By means of an appropriate test program processing at the boundary scan test controller/equipment 299, all of the components 252, 254, 256, 212, 214, 216 of the board 210 can be tested, the board 210 itself can be tested, the memories 212, 214 can be checked and finally the programmable memory 216, here depicted as a FLASH memory, can be programmed.

A typical programming cycle will comprise several writes to and reads from the programmable memory 216. In this setup, if it was the test access port of the CPU 254 which controlled the programming of the programmable memory 216, then every write or programming pulse will have to be serially clocked through the first I/O controller 252. Likewise a verification read from the programmable memory 216 will need to be serially clocked through the second I/O controller 256. Every single extra clock cycle in a programming cycle programming a byte, for example, will increase programming times tremendously for large memories leading to unacceptable programming times in the magnitude of hours.

Programming times are reduced to single minutes by programming programmable memories. The boundary scan cell chain length is reduced to an absolute minimum, i.e. the boundary scan cell chain length as seen from the boundary scan test controller. This is accomplished by connecting a boundary scan unit/component directly onto the programmable memory. The boundary scan unit can suitably be dedicated to just one type of memory, to thereby optimize the necessary boundary scan cell chain length to a minimum.

Figure 3:
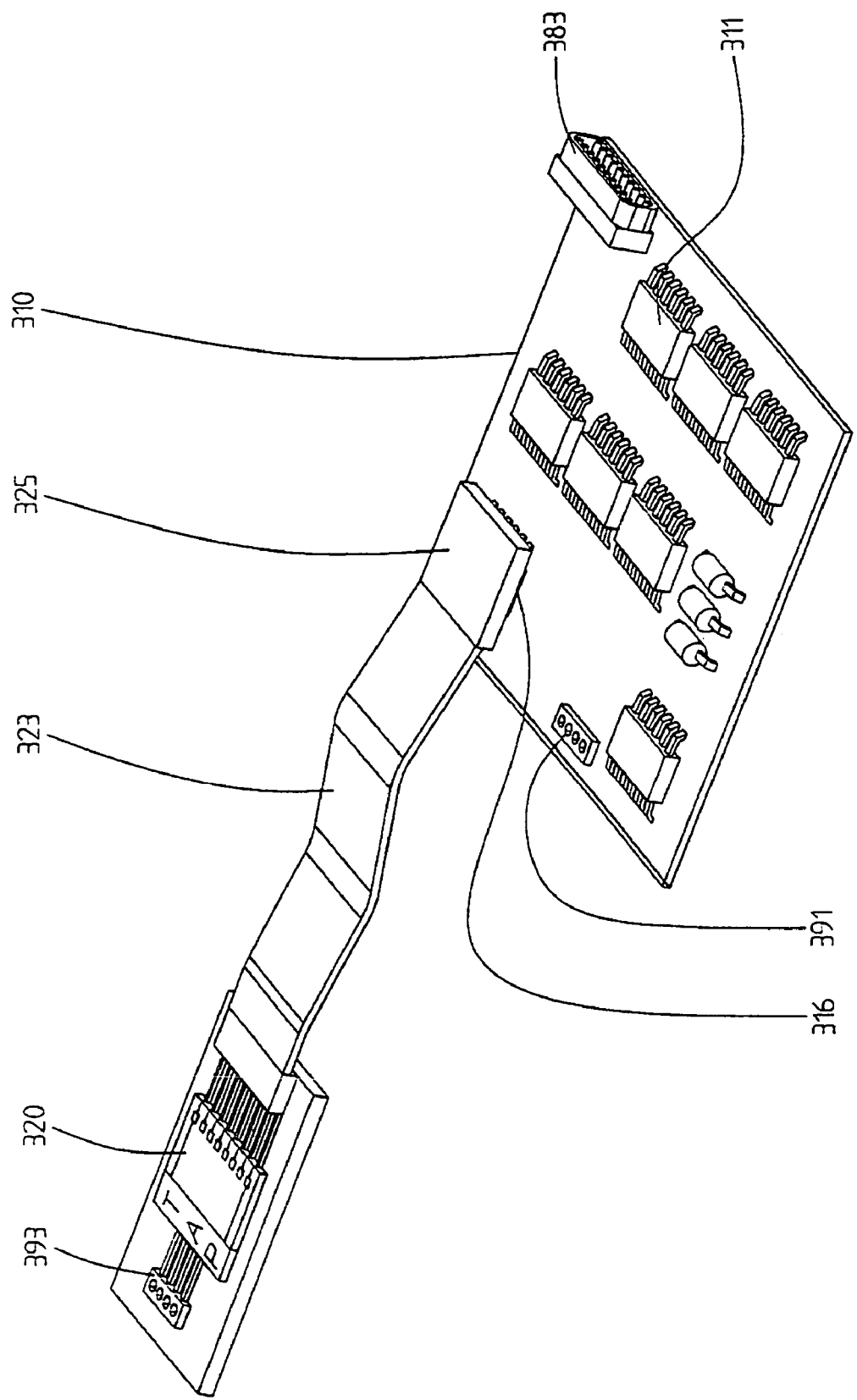
FIG. 3 illustrates a unit and a method according to the invention of programming a programmable memory by means of boundary scan test controller.

FIG. 3 illustrates a unit and a method of programming a programmable memory 316 mounted on a circuit board 310 by means of boundary scan test controller. A circuit board 310, which comprises one or more integrated circuits 311 and other components, such as an I/O port 383, also comprises a programmable memory 316, which would normally be programmed by means of boundary scan components on the circuit board 310 connected via a testbus 391 to a boundary scan test controller (not shown). A boundary scan test controller is instead connected to a dedicated boundary scan component 320 via another test bus 393. The dedicated, or programming, boundary scan component 320 is directly coupled 323, 325 to the programmable memory 316, which is to be programmed. The programming boundary scan component 320 can suitably be coupled to the programmable memory 316 via a connection cable 323 and by means of a test clip 325 or the like. The test clip 325 is used to easily be able to couple to and uncouple from programmable memories.

By directly coupling 323, 325 a dedicated boundary scan component 320 to a programmable memory 316, the boundary scan cell chain length to access and control the programming of the programmable memory 316, is reduced to a minimum. The only differences a boundary scan test controller will be subjected to, with regard to programming a programmable memory, is that the test controller must be connected to the test bus 393 of the dedicated boundary scan component 320 instead of to the testbus 391 of the circuit board, and the program for programming the programmable memory needs to be adjusted to a shorter boundary scan cell chain length. Programmable memories, which are mounted on boards without boundary scan components and testbus connectors, can also be programmed by a boundary scan test controller via a dedicated/programming boundary scan component 320.

Figure 4:
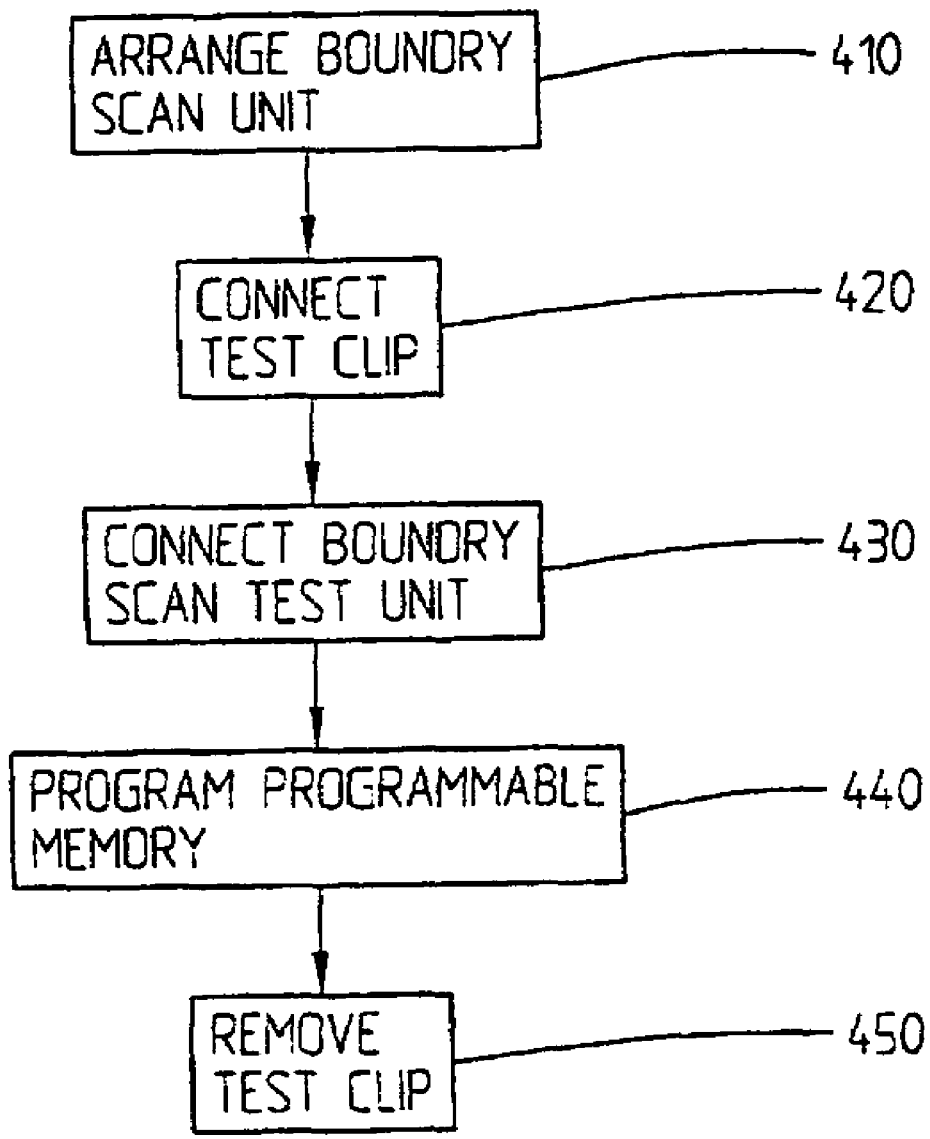
FIG. 4 illustrates a flow diagram of a method of programming a programmable memory according to the invention by means of a boundary scan test controller.

FIG. 4 illustrates a flow diagram of a method of programming a programmable memory by means of a boundary scan test controller. In a first step 410 a programming boundary scan test unit is arranged, according to the invention, with a dedicated/programming boundary scan component which is to be directly connectable with a programmable memory and connectable to a boundary scan test controller. Boundary scan cells of the boundary scan component of the programming boundary scan test unit are electrically connected, for example, to a test clip, which in turn can be easily electrically connected to, and disconnected from, a programmable memory to be programmed. A test access port of the boundary scan component is connectable to the boundary scan test controller, usually by means of a suitable cable and connectors.

A boundary scan test program, to be run on the boundary scan test controller, for programming the programmable memory, needs either to be developed or extracted/adapted from for example an existing boundary scan test program for the complete board on which the programmable memory in question is mounted. An adaptation usually involves isolating parts of the program that programs the programmable memory and also in adjusting the boundary scan cell chain length & position, i.e. the serial position of the boundary scan cells that control and program the programmable memory is changed. The type of programmable memory will dictate the program that programs the programmable memory. The specific programming boundary scan test unit will dictate the scan cell chain length & position. Scan cell chain length & position will in some cases also have to be changed/adapted in dependence on the type of IC packaging the programmable memory has. The first step 410 is usually only performed once for a specific memory type.

After the first step 410, a second step 420 ensures that the programming boundary scan test unit is connected with a programmable memory to be programmed, typically by means of a test clip or the like. After the first step 410 there is also a third step 430 of connecting the programming boundary scan test unit to the boundary scan test controller. The third step is usually only performed once per session. After the second 420 and the third step 430 have been performed, then a fourth step 440 programs the programmable memory by executing the boundary scan test program in the boundary scan test controller. When the programming in the fourth step 440 is completed, then in a fifth step 450 the test clip is removed from the programmed memory.

The technology described is based on connecting a boundary scan component directly onto a programmable memory to eliminate boundary scan cells in the boundary scan cell chain when programming the memory. The invention is not restricted to the above-described example embodiments, but may be varied within the scope of the following claims.

The invention claimed is:

1. A unit for programming a programmable memory using boundary scan test equipment, comprising:
    a test clip arranged to be directly attachable to and removable from the programmable memory;
    a boundary scan connector arranged to be connected with boundary scan programming equipment;
    a boundary scan unit including a test access port connected to the boundary scan connector and boundary scan cells which are connected to the test clip, the boundary scan unit being arranged to receive instructions, addresses, and corresponding data via its test access port via the boundary scan connector, to thereby be able to control the boundary scan cells to enable programming of the programmable memory, wherein the boundary scan unit is configured to only use the boundary scan cells connected to the test clip to increase a speed at which the programming can be performed.

2. The unit according to claim 1, wherein the boundary scan unit is configured to only use boundary scan cells needed for the programming the programmable memory.

3. A method of programming a programmable memory using boundary scan test equipment, comprising:
    arranging a boundary scan unit having boundary scan cells and having a test access port to be connected to a test clip through the boundary scan cells and to be connected to a boundary scan connector by way of the test access port;
    connecting the test clip directly onto the programmable memory;
    connecting the boundary scan connector to the boundary scan test equipment;
    programming the programmable memory by executing a boundary scan program comprising instructions and information for programming the programmable memory, wherein a speed at which the programming is performed is increased using the test clip connected to the boundary scan connector; and
    removing the test clip from the programmable memory, wherein the boundary scan unit only uses boundary scan cells connected to the test clip while the programmable memory is being programmed.

4. The method according to claim 3, wherein the step of programming the programmable memory includes executing a boundary scan program that only comprises instructions and information for programming the programmable memory.

5. The method in claim 3, wherein the boundary scan unit only uses boundary scan cells needed for the programming the programmable memory.

* * * * *